(12) United States Patent
Yoshioka et al.

(10) Patent No.: US 8,338,968 B2
(45) Date of Patent: *Dec. 25, 2012

(54) SEMICONDUCTOR DEVICE AND A METHOD OF MANUFACTURING THE SAME

(75) Inventors: Akihiko Yoshioka, Tokyo (JP); Shinya Suzuki, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/396,456

(22) Filed: Feb. 14, 2012

(65) Prior Publication Data
US 2012/0139106 A1    Jun. 7, 2012

Related U.S. Application Data

(60) Continuation of application No. 12/766,567, filed on Apr. 23, 2010, which is a division of application No. 11/953,068, filed on Dec. 9, 2007, now Pat. No. 7,728,442, which is a division of application No. 11/543,859, filed on Oct. 6, 2006, now abandoned.

(30) Foreign Application Priority Data

Oct. 7, 2005  (JP) .................................. 2005-294902

(51) Int. Cl.
H01L 23/48 (2006.01)
H01L 29/40 (2006.01)
(52) U.S. Cl. ......... 257/780; 257/735; 257/737; 438/613
(58) Field of Classification Search .................. 257/780, 257/735–737, E23.021; 438/613–617
See application file for complete search history.

(56) References Cited

U.S. PATENT DOCUMENTS

| | | | |
|---|---|---|---|
| 5,485,038 A | 1/1996 | Licari et al. |
| 6,313,024 B1 | 11/2001 | Cave et al. |
| 6,492,692 B1 | 12/2002 | Ishii et al. |
| 6,538,326 B2 | 3/2003 | Shimizu et al. |
| 6,563,216 B1 | 5/2003 | Kimura et al. |
| 6,573,170 B2 | 6/2003 | Aoyagi et al. |
| 6,900,541 B1 | 5/2005 | Wang et al. |

(Continued)

FOREIGN PATENT DOCUMENTS

| | | |
|---|---|---|
| JP | 9-22912 A | 1/1997 |
| JP | 10-233507 A | 9/1998 |
| JP | 2001-53100 A | 2/2005 |
| JP | 2005-268281 A | 9/2005 |

OTHER PUBLICATIONS

Office Action dated Jan. 19, 2012 in Taiwan Application No. 095137258.

Primary Examiner — Theresa T Doan
(74) Attorney, Agent, or Firm — Miles & Stockbridge P.C.

(57) ABSTRACT

A semiconductor device manufacturing technique which allows reduction of semiconductor chip size. First, a pad and other wires are formed over an insulating film. A surface protective film is formed over the insulating film including the pad and wires, and an opening is made in the surface protective film. The opening lies over the pad and exposes a surface of the pad. A bump electrode is formed over the surface protective film including the opening. Here, the pad is smaller than the bump electrode. Consequently, the wires are arranged just beneath the bump electrode in the same layer as the pad 10. In other words, the wires are arranged in space which becomes available because the pad is small enough.

36 Claims, 12 Drawing Sheets

U.S. PATENT DOCUMENTS

| | | |
|---|---|---|
| 7,251,010 B2 | 7/2007 | Miyasaka |
| 7,538,430 B2 * | 5/2009 | Yoshioka et al. ............. 257/737 |
| 7,728,442 B2 * | 6/2010 | Yoshioka et al. ............. 257/780 |
| 2003/0164843 A1 | 9/2003 | Sakaguchi |
| 2006/0154469 A1 | 7/2006 | Hess et al. |
| 2008/0099894 A1 | 5/2008 | Yoshioka et al. |
| 2008/0116462 A1 | 5/2008 | Suzuki |
| 2008/0303968 A1 | 12/2008 | Terada et al. |

* cited by examiner

SEMICONDUCTOR DEVICE AND A METHOD OF MANUFACTURING THE SAME

CROSS-REFERENCE TO RELATED APPLICATIONS

This application is a continuation of application Ser. No. 12/766,567 filed Apr. 23, 2010, which is a division of application Ser. No. 11/953,068 filed Dec. 9, 2007 (now U.S. Pat. No. 7,728,442 issued Jun. 1, 2010), which is a division of application Ser. No. 11/543,859 filed Oct. 6, 2006 (now abandoned).

BACKGROUND OF THE INVENTION

The present invention relates to a semiconductor device and a method of manufacturing the same and more particularly to a technique which is useful for semiconductor devices used in LCD (Liquid Crystal Display) drivers.

Japanese Unexamined Patent Publication No. Hei 10 (1995)-233507 discloses a technique which reduces the chip area and achieves production efficiency improvement and cost reduction regarding semiconductor integrated circuits such as driver ICs with many output pads and electronic circuit devices such as electronic clocks.

Concretely, an output pads is placed over a drive transistor to be connected with the output pad or over a logic circuit so that they overlap each other as seen in a plan view. Furthermore, not only aluminum wires but also bump electrodes or barrier metals are used for semiconductor device wiring interconnection. Also, in a case that a semiconductor integrated circuit is electrically bonded over a printed circuit board face down, electrical connections are made by directly connecting solder bumps of the semiconductor integrated circuit with wires of the printed circuit board. In this case, bump electrodes as external connection terminals for the semiconductor integrated circuit are stacked over transistors.

For example, FIG. 18 of the above patent document shows that a bump output pad lies over a drive transistor. Hence, since the drive transistor and the output pad overlap as seen in a plan view, the chip area can be reduced. Furthermore, FIG. 26 of the document shows that one diffusion area and another diffusion area are electrically connected by bump interconnection. This structure makes it possible to have one more wiring layer as compared with the conventional structure.

SUMMARY OF THE INVENTION

In recent years, LCDs which use liquid crystal for display devices have been spreading rapidly. These LCDs are controlled by drivers which drive them. An LCD driver comprises a semiconductor chip, which is typically mounted on a glass substrate. The semiconductor chip which constitutes the LCD driver has a structure that plural transistors and multi layer interconnections are formed over a semiconductor substrate with bump electrodes on its surface. The chip is mounted over the glass substrate through the bump electrodes formed on the surface. Here, the semiconductor chip and the glass substrate are connected through the bump electrodes. For the purpose of increasing the adhesive force, the bump electrode area is enlarged to increase the area of contact between the semiconductor chip and the glass substrate. In other words, bump electrodes of a semiconductor chip which constitutes an LCD driver are much larger than bump electrodes of semiconductor chips for general purposes.

In an LCD driver, an insulating film which functions as a passivation film is formed under bump electrodes and connected with pads formed in the top layer of the multilayer interconnection through openings in the insulating film. Usually the area of an opening and the area of a pad are determined according to the area of a bump electrode so that they are almost equal.

As mentioned above, pads which match large bump electrodes are formed in the top layer of the semiconductor chip multilayer interconnection. More specifically, pads which have almost the same area as the bump electrodes are formed in the top layer. This means that in order to leave space for forming interconnection wires different from pads in the top layer of the multilayer interconnection, the semiconductor chip size must be larger.

Another problem is that in a normal structure in, which bump electrodes are formed just above bonding pads, the positions of bump electrodes are fixed and there are limitations about the layout arrangement of wiring elements such as pads. Consequently it is difficult to adopt a layout arrangement which permits efficient reduction of semiconductor chip size.

An object of the present invention is to provide a technique which permits reduction of semiconductor chip size.

Another object of the invention is to provide a technique which permits greater latitude in the layout arrangement of interconnection wires formed in the semiconductor chip.

The above and further objects and novel features of the invention will become more apparent from the following detailed description in this specification and the accompanying drawings.

Preferred embodiments of the invention which will be disclosed herein are briefly outlined below.

According to one aspect of the present invention, a semiconductor device includes a semiconductor chip which comprises: (a) a pad formed over a semiconductor substrate; (b) an insulating film having an opening over the pad; and (c) a bump electrode formed over the insulating film including the opening. Here, the bump electrode is larger than the pad; and a wire different from the pad is formed in a layer under the bump electrode through the insulating film.

According to another aspect of the invention, a semiconductor device includes a semiconductor chip which comprises: (a) a pad formed over a semiconductor substrate; (b) an insulating film having an opening over the pad; and (c) a bump electrode formed over the insulating film including the opening. Here, the bump electrode is larger than the pad; and the bump electrode includes a first portion with a small width and a second portion with a width larger than the width of the first portion.

According to a further aspect of the invention, a method of manufacturing a semiconductor device comprises the steps of: (a) forming, in a layer over a semiconductor substrate, a pad and a wire which is different from the pad; (b) forming an insulating film over the pad and the wire different from the pad; (c) making an opening in the insulating film to expose a surface of the pad; and (d) forming a bump electrode over the insulating film including the opening. Here the pad and the wire different from the pad are formed in a layer under the bump electrode through the insulating film.

According to a further aspect of the invention, a method of manufacturing a semiconductor device comprises the steps of (a) forming a pad over a semiconductor substrate and (b) forming an insulating film over the pad. It further comprises the steps of (c) making an opening in the insulating film to expose a surface of the pad and (d) forming a bump electrode over the insulating film including the opening. Here the bump electrode includes a first portion with a small width and a second portion with a width larger than the width of the first portion.

The effect brought about by preferred embodiments of the present invention is briefly described below.

The space beneath a bump electrode can be used effectively and the semiconductor chip size can be reduced. Pads can be arranged regardless of bump electrode positions, which permits greater latitude in the layout arrangement of interconnection wires including pads.

BRIEF DESCRIPTION OF THE DRAWINGS

The invention will be more particularly described with reference to the accompanying drawings, in which.

DETAILED DESCRIPTION OF THE PREFERRED EMBODIMENTS

Figure 1:
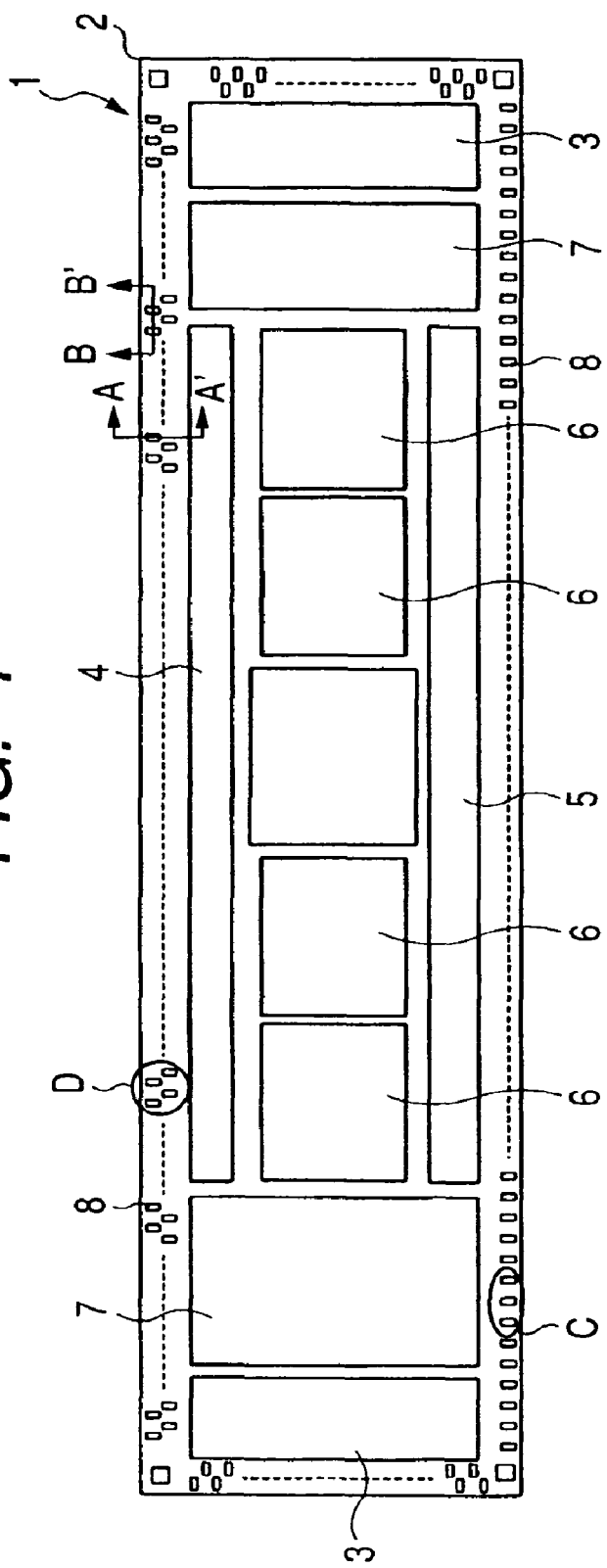
FIG. 1 is a plan view of a semiconductor chip according to a first embodiment of the present invention.

The preferred embodiments described below will be described separately as necessary, but they are not irrelevant to each other unless otherwise specified. They are, in whole or in part, variations of each other and sometimes one description is a detailed or supplementary form of another.

Also, in the preferred embodiments described below, even when the numerical datum for an element (the number of pieces, numerical value, quantity, range, etc.) is indicated by a specific numerical figure, it is not limited to the indicated specific numerical figure unless otherwise specified or theoretically limited to the specific numerical figure; it may be larger or smaller than the specific numerical figure.

In the preferred embodiments described below, it is needles to say that their constituent elements (including constituent steps) are not necessarily essential unless otherwise specified or considered theoretically essential.

Similarly, in the preferred embodiments described below, when a specific form or positional relation is indicated for an element, it should be interpreted to include forms or positional relations which are virtually equivalent or similar to the specific one unless otherwise specified or unless only the specific one should be used from a theoretical viewpoint. The same can be said of numerical values or ranges as mentioned above.

Next, preferred embodiments of the present invention will be described in detail referring to the accompanying drawings. In all the drawings that illustrate the preferred embodiments, elements with like functions are basically designated by like reference numerals and repeated descriptions thereof are omitted.

First Embodiment

FIG. 1 is a plan view showing the structure of a semiconductor chip 1 (semiconductor device) according to the first embodiment. The semiconductor chip 1 according to the first embodiment is a driver for an LCD. Referring to FIG. 1, the semiconductor chip 1 has a semiconductor substrate 2 which takes the form of, for example, an elongated rectangle, and for example, an LCD driver which drives a liquid crystal display is formed on its main surface. This driver has the function of controlling the orientations of liquid crystal molecules by supplying voltage to each pixel in a cell array constituting the LCD and includes gate drive circuits 3, a source drive circuit 4, a liquid crystal circuit 5, graphic RAMs (Random Access Memories) 6, and peripheral circuits 7.

In the vicinity of the periphery of the semiconductor chip 1, a plurality of bump electrodes 8 are arranged at regular intervals along the periphery of the semiconductor chip 1. These bump electrodes 8 lie over active regions where elements and interconnection wires of the semiconductor chip 1 are located. The plural bump electrodes 8 include bump electrodes for integrated circuits which are necessary for an integrated circuit configuration and dummy electrodes which are not necessary for the integrated circuit configuration. Bump electrodes 8 are arranged in a zigzag pattern in the vicinities of one long edge and the two short edges of the semiconductor chip 1. The plural bump electrodes 8 arranged in a zigzag pattern are mainly used as bump electrodes for gate output signals or source output signals. The bump electrodes 8 arranged in a zigzag pattern around the center of the long edge of the semiconductor chip 1 are bump electrodes for source output signals and those arranged in a zigzag pattern along the long edge of the semiconductor chip 1 in the vicinities of its corners and those arranged in a zigzag pattern along the short edges of the semiconductor chip 1 are bump electrodes for gate output signals. This zigzag pattern allows arrangement of many bump electrodes necessary for gate output signals and source output signals while eliminating the need for increase in the size of the semiconductor chip 1. In other words, it is possible to reduce the chip size and increase the number of bump electrodes at the same time.

In the vicinity of the other long edge of the semiconductor chip 1, bump electrodes 8 are arranged not in a zigzag pattern but linearly. The linearly arranged bump electrodes 8 are bump electrodes for digital input signals or analog input signals. Also dummy bump electrodes are arranged around the four corners of the semiconductor chip 1. In the example shown in FIG. 1, bump electrodes 8 for gate output signals or source output signals are arranged in a zigzag pattern and bump electrodes 8 for digital input signals or analog input signals are arranged linearly. However it is also possible that bump electrodes 8 for gate output signals or source output signals are arranged linearly and bump electrodes 8 for digital input signals or analog input signals are arranged in a zigzag pattern.

Figure 2:
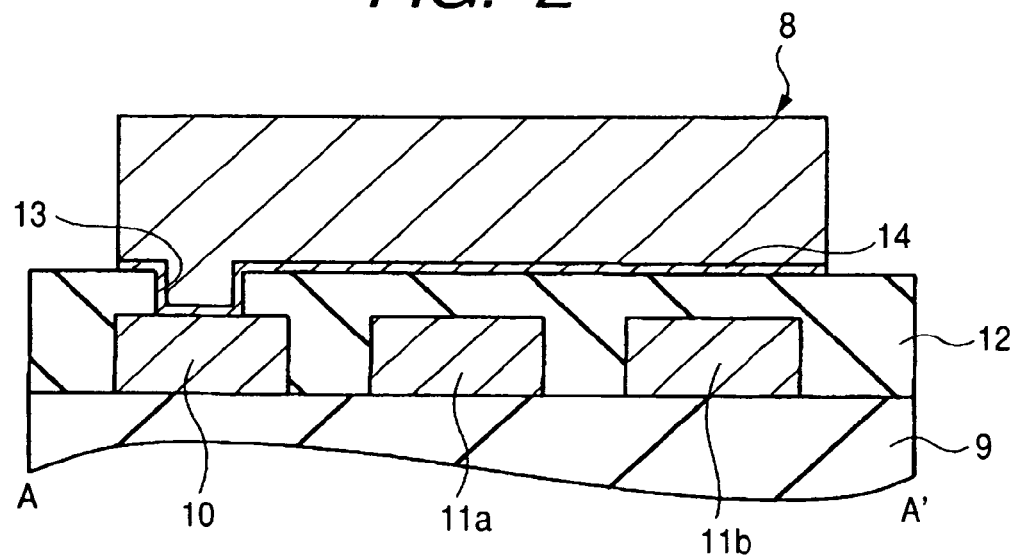
FIG. 2 is a sectional view taken along the line A-A' of FIG. 1.

FIG. 2 is a sectional view taken along the line A-A' of FIG. 1. In FIG. 2, the layers under the top layer are omitted. Although not shown in FIG. 2, a semiconductor element such as a MTSFET (Metal Insulator Semiconductor Field Effect Transistor) is formed over the semiconductor substrate and a multilayer interconnection is made over the semiconductor element. FIG. 2 shows the multilayer interconnection above the top layer of the multilayer interconnection structure.

As shown in FIG. 2, top layer interconnection wiring is made over the insulating film 9 of, for example, oxide silicon. The top layer interconnection wiring includes, for example, a pad 10 and wires different from the pad 10, 11a and 11b. The wires 11a and 11b are, for example, signal wires for signals or power wires for power supply or dummy wires. The pad 10 and wires 11a and 11b consist of, for example, an aluminum film.

A surface protective film (passivation film) 12 is formed over the pad 10 and wires 11a and 11b so as to cover the pad and wires 11a and 11b. For example, the surface protective film 12 consists of an insulating film of silicon nitride. An opening 13 is made in the surface protective film 12 to expose a surface of the pad 10 and a bump electrode 8 is formed over the surface protective film 12 including the inside of the opening 13 through a UBM film 14 as an undercoat metal film.

Under the bump electrode 8 are the wiring layer including the pad 10 and wires 11a, 11b, and plural other wiring layers (not shown) lying under the wiring layer including the pad 10 and wires 11a, 11b. Similarly, a semiconductor element such as the abovementioned MISFET (not shown) is formed under the bump electrode 8. Thus, this embodiment makes it possible to reduce the chip area of the semiconductor chip 1 by efficient use of space under the bump electrode 8.

One characteristic point of the present invention is that the opening 13 and the pad 10 are smaller than the bump electrode 8. Conventionally an opening 13 whose size is almost equal to the bump electrode 8 has been formed under the bump electrode 8 and a pad 10 larger than the bump electrode 8 has been formed under the opening 13. In other words, the pad 10 has been formed under the bump electrode 8 and the size of the pad 10 has been almost the same as the size of the bump electrode 8. However, in the semiconductor chip 1 which constitutes an LCD driver, the bump electrode 8 should be enlarged in order to ensure its adhesion to the glass substrate. Hence, the pad 10 which is formed in a layer under the bump electrode 8 should be larger. If the pad 10 is too large, it would be difficult to leave space for wires different from the pad 10 in the top layer of the multilayer interconnection and as a consequence the size of the semiconductor chip 1 would have to be increased. On the other hand, in this first embodiment, the opening 13 and the pad 10 are smaller than the bump electrode 8 as shown in FIG. 2. Put another way, the bump electrode 8 is larger than the pad 10. When the pad 10 is smaller than the bump electrode 8 in this way, space is left for wires different from the pad 10, 11a and 11b, in a layer under the bump electrode 8. This may be put as follows. In the conventional structure, because the pad 10 lies in the top layer just beneath the bump electrode 8, it has been impossible to make other wires in the same top layer. On the other hand, in the first embodiment, since the pad 10 is smaller than the bump electrode 8, space available for formation of other wires 11a and 11b is left just beneath the bump electrode 8 in the same top layer in which the pad 10 lies. Therefore, it is possible to form wires 11a and 11b just beneath the bump electrode 8 in addition to the pad 10, so that space just beneath the bump electrode 8 can be used effectively and the size of the semiconductor chip 1 can be reduced.

The first embodiment is characterized in that the size of the bump electrode 8 remains unchanged and the pad 10 is smaller than the bump electrode 8, leaving space for formation of wires different from the pad 10 for the bump electrode 8. In sum, while the area of the bump electrode 8 to adhere to the glass substrate is large enough, space for wires different from the pad 10 is left so that the size of the semiconductor chip 1 can be reduced. This technical idea is not described nor suggested even in the patent document cited earlier under the heading "BACKGROUND OF THE INVENTION" and unique to this first embodiment. For example, it is possible to make the bump electrode larger than the pad by increasing the size of the bump electrode without changing the pad size; however, in this case, the size of the pad itself is not reduced and space left by reducing the pad size cannot be obtained. Consequently the size of the semiconductor chip cannot be reduced. Besides, a larger bump electrode leads to a larger semiconductor chip, which means that it is impossible to reduce the size of the semiconductor chip. As discussed above, there are two approaches to realizing a pad electrode smaller than a bump electrode: one is to increase the size of the bump electrode and the other is to reduce the size of the pad. These two approaches are the same in that the pad electrode is smaller than the bump electrode but the approach in which the pad size is reduced is considerably different from the other approach in that space for wires different from the pad is left under the bump electrode in the same layer in which the pad lies. In addition, since the size of the pad itself is reduced, the pad width may be smaller than a relatively wide wire different from the pad, such as a power wire.

Figure 3:
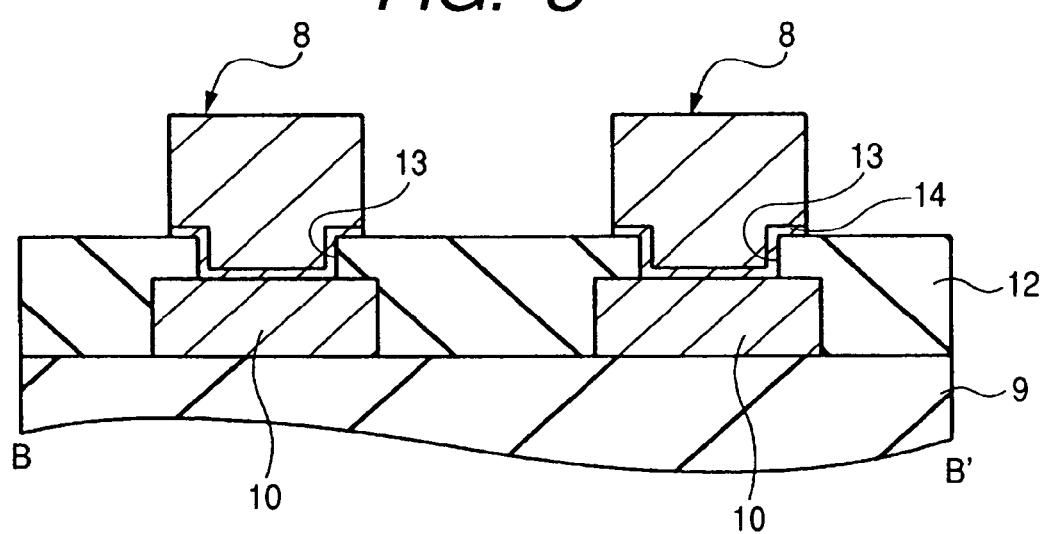
FIG. 3 is a sectional view taken along the line B-B' of FIG. 1.

FIG. 3 is a sectional view taken along the line B-B' of FIG. 1. As shown in FIG. 3, in the cross section taken along the line B-B', a pad 10 is formed over the insulating film 9 and a surface protective film 12 is formed so as to cover the pad 10. An opening 13 is made in the surface protective film 12 and a surface of the pad 10 is exposed at the bottom of the opening 13. A bump electrode 8 is formed over the surface protective film 12 including the inside of the opening 13 through a UBM film 14. In the direction of the cross section taken along the line B-B', the width of the pad 10 is almost equal to, or larger than, the width of the bump electrode 8. In other words, in the direction of the cross section taken along the line A-A' of FIG. 2, the width of the pad 10 is smaller than the width of the bump electrode 8, and the pad 10 and other signal wires and power wires are formed just beneath the bump electrode 8. On the other hand, in the direction of the cross section taken along the line B-B' of FIG. 3, the width of the pad 10 formed just beneath the bump electrode 8 is almost equal to that of the bump electrode 8.

Figure 4:
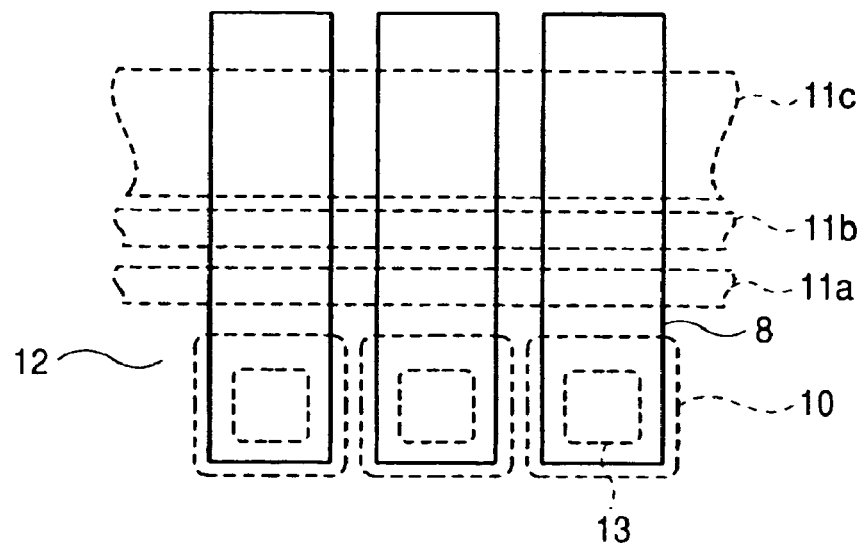
FIG. 4 is an enlarged plan view of a region as indicated by line C of FIG. 1 showing that wires are formed just beneath linearly arranged bump electrodes.

FIG. 4 is an enlarged plan view of region C of FIG. 1 showing that wires are formed just beneath linearly arranged bump electrodes 8. As shown in FIG. 4, rectangular bump electrodes 8 lie side by side along the short edge direction (perpendicular to the long edge direction). A surface protective film 12 is formed under the bump electrodes 8 and openings 13 are made in the surface protective film 12. A pad 10 is formed in a layer under the opening 13 made in the surface protective film 12. The pad 10 is electrically connected with a bump electrode 8 partially buried in the opening. The pad 10 is square and one edge thereof is slightly longer than the short edge of the bump electrode 8. Consequently as shown in FIG. 4, the length of the pad 10 is slightly larger than the length of the bump electrode 8 in the short edge direction of the bump electrode 8. On the other hand, the length of the pad 10 is far smaller than the length of the bump electrode 8 in the long edge direction of the bump electrode 8. Specifically, the pad 10 is smaller than the bump electrode 8 and the pad 10 lies only under one end of the bump electrode 8. Therefore, in the long edge direction of the bump electrode 8, space is left in the same wiring layer in which the pad 10 lies. Wires 11a to 11c which are different from the pad 10 are formed in this space. According to the first embodiment, as mentioned above, wires 11a to 11c can be formed just beneath the bump electrode 8 in the same layer in which the pad 10 lies. Since space just beneath the rectangular large bump electrode 8 can be used effectively, the size of the semiconductor chip can be reduced.

The wires 11a to 11c are signal wires, power wires or dummy wires and may have different widths. FIG. 4 indicates that the wire 11c is wider than the wires 11a and 11b. Conventionally the pad size has been similar to the size of the bump electrode 8 and the pad width is relatively large as compared with other wires. On the other hand, in this first embodiment, the pad 10 is smaller than the bump electrode 8 and space available for formation of wires is left just beneath the bump electrode 8. Therefore, the width of the pad 10 may be smaller than, for example, the width of a power wire formed in the abovementioned space. Thus, according to the first embodiment, the width of the pad 10 may be smaller than the width of another wire.

The wires 11a to 11c extend along the direction perpendicular to the long edge direction of the bump electrode 8. Although it is desirable from the viewpoint of effective use of space that the wires 11a to 11c should be perpendicular to the long edge direction of the bump electrodes 8, they need not necessarily be perpendicular to the long edge direction of the bump electrodes 8. For example, the wires may obliquely intersect with the long edges of the bump electrodes 8 depending on the interconnection pattern. Even if that is the case, space just beneath the bump electrode 8 is available and the semiconductor chip can be smaller.

Figure 5:
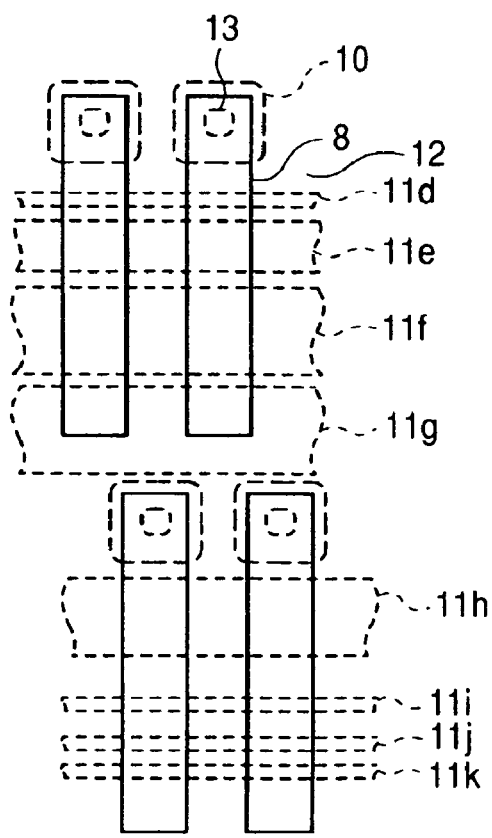
FIG. 5 is an enlarged plan view of a region as indicated by line D of FIG. 1 showing that wires are formed just beneath bump electrodes arranged in a zigzag pattern.

FIG. 5 is an enlarged plan view of region D of FIG. 1 showing that wires lie just beneath bump electrodes 8 arranged in a zigzag pattern. As shown in FIG. 5, as in FIG. 4, in the long edge direction of the bump electrode 8, the width of the bump electrode 8 is far larger than the width of the pad 10, and space is left in the long edge direction of the bump electrode 8 in the same layer in which the pad 10 lies. Wires 11d to 11k are formed in this space. When bump electrodes 8 are arranged in a zigzag pattern, they form two rows as shown in FIG. 5. Therefore, space left just beneath bump electrodes 8 is larger than when bump electrodes 8 form one row. This means that if a pad whose size is similar to the size of a bump electrode 8 is formed, it would be impossible to form other wires in addition to the pad just beneath the bump electrode 8.

In this case, when bump electrodes 8 are arranged in a zigzag pattern, which means they are arranged in two rows, space available for formation of wires would be smaller than when bump electrodes 8 are arranged in one row. However, as shown in FIG. 5, in the first embodiment, wires 11d to 11g are formed just beneath the bump electrodes 8 in the first row and wires 11h to 11k are formed just beneath the bump electrodes 8 in the second row. Therefore, even when the bump electrodes 8 are arranged in a zigzag pattern, space just beneath the bump electrodes 8 can be used almost as effectively as when they are arranged in one row. Regarding bump electrodes 8 of the semiconductor chip, wires can be formed not only beneath bump electrodes 8 arranged in one row but also beneath the ones in a zigzag pattern and the semiconductor chip size can be thus reduced.

Figure 15:
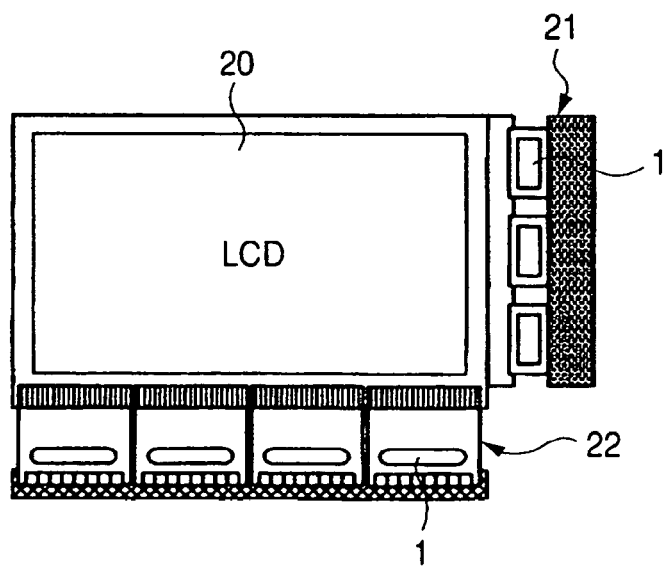
FIG. 15 shows the general structure of another type of LCD.

The number of bump electrodes 8 in region D of FIG. 1 (FIG. 5) is larger than in region C of FIG. 1 (FIG. 4). This is because more bump electrodes 8 are needed in region D of FIG. 1 in order to drive elements of an LCD screen area 20 (described later) as shown in FIG. 15. The bump electrodes 8 in region D of FIG. 1 are mainly used for gates and sources of elements of the LCD screen area 20.

Figure 6:
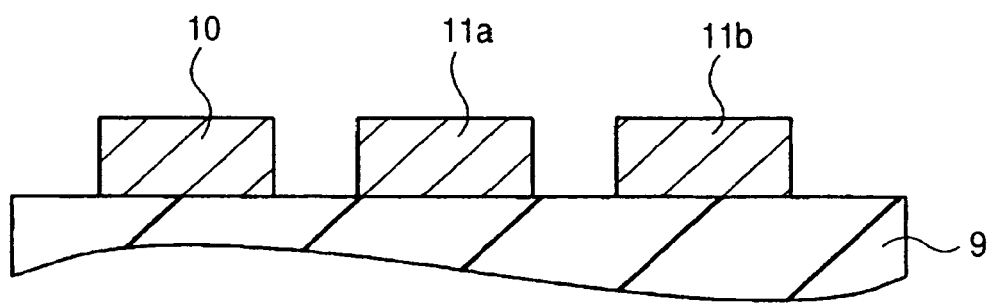
FIG. 6 is a sectional view showing a step in a semiconductor device manufacturing process according to the first embodiment.

Next, the method of manufacturing a semiconductor device according to the first embodiment will be described referring to the accompanying drawings. A semiconductor element such as a MISFET is formed over, for example, a semiconductor substrate of silicon single crystal, and a multilayer interconnection is made over the semiconductor element, though not shown. FIG. 6 shows wires formed in the top layer where the layers under the wires in the top layer are omitted.

For example, an insulating film 9 of oxide silicon is formed as shown in FIG. 6. The insulating film 9 may be formed using a CVD (Chemical Vapor Deposition) process. A titanium or titanium nitride film, an aluminum film and a titanium or titanium nitride film are stacked over the insulating film 9. Then, patterning is done on the stacked films by photolithography or etching and a pad 10 and wires 11a and 11b are formed by this patterning process. The pad 10 thus formed is smaller than a bump electrode formed by a process which will be described later. The wires 11a and 11b are formed just beneath a bump electrode.

Figure 7:
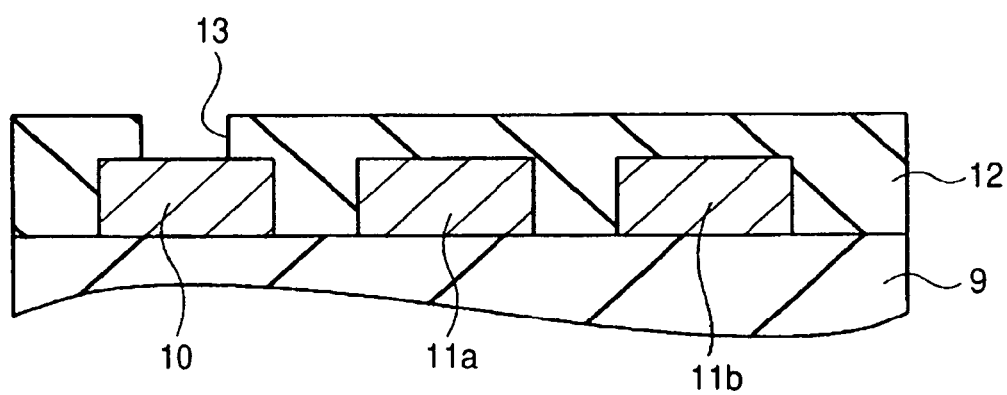
FIG. 7 is a sectional view showing a step next to the step of FIG. 6 in the semiconductor device manufacturing process.

Next, as shown in FIG. 7, a surface protective film 12 is formed over the insulating film 9 in which the pad 10 and wires 11a and 11b are formed. The surface protective film 12 consists of, for example, a silicon nitride film and is made by a CVD process. Next, an opening 13 is made in the surface protective film 12 by photolithography or etching. This opening 13 lies over the pad 10 and exposes a surface of the pad 10. The opening 13 should be smaller than the pad 10.

Figure 8:
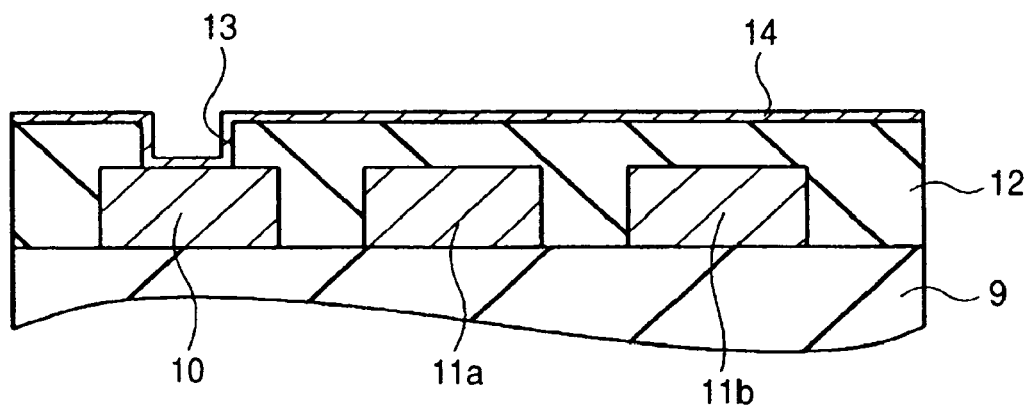
FIG. 8 is a sectional view showing a step next to the step of FIG. 7 in the semiconductor device manufacturing process.

Next, as shown in FIG. 8, a UBM (Under Bump Metal) film 14 is formed over the surface protective film 12 including the inside of the opening 13. The UBM film 14 is made by sputtering and consists of a single film of titanium, nickel, palladium, titanium-tungsten alloy, titanium nitride or gold or a laminate of films of these materials. The UBM film 14 has not only the function of improving the adhesion of the bump electrode 8 to the pad 10 and surface protective film 12 but also the barrier function which suppresses or prevents movement of the metal element of a conductive film 16 made by a subsequent process toward the wire 11a, 11b or the like, or movement of the metal element of the wire 11a, 11b or the like toward the conductive film 16. The plan view size of the UBM film 14 is larger than that of the opening 13 and almost equal to that of the conductive film 16.

Figure 9:
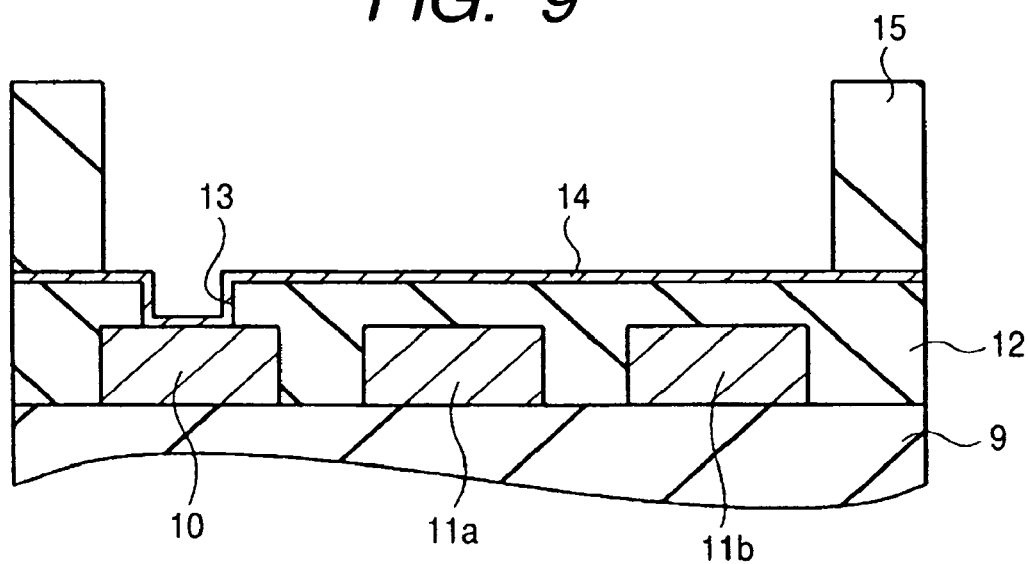
FIG. 9 is a sectional view showing a step next to the step of FIG. 8 in the semiconductor device manufacturing process.
Figure 10:
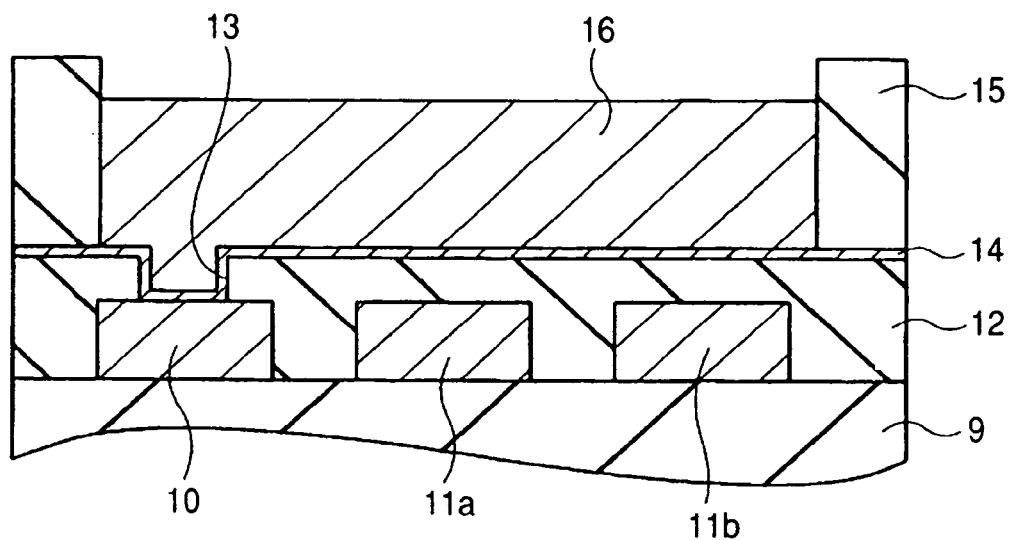
FIG. 10 is a sectional view showing a step next to the step of FIG. 9 in the semiconductor device manufacturing process.
Figure 11:
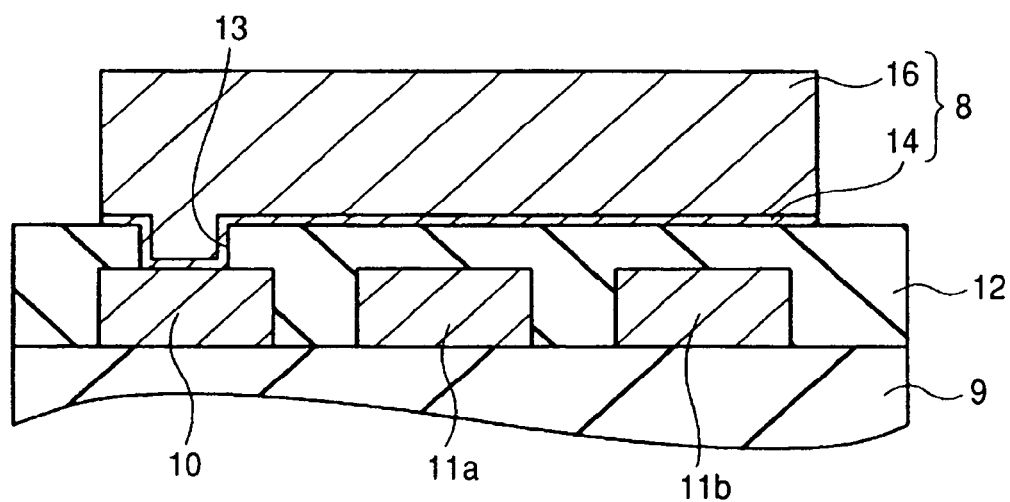
FIG. 11 is a sectional view showing a step next to the step of FIG. 10 in the semiconductor device manufacturing process.

Next, as shown in FIG. 9, after a resist film 15 is coated over the UBM film 14, patterning is done by exposure and development of the resist film 15. Patterning is done in a way not to leave the resist film 15 in the bump electrode formation region. Then, as shown in FIG. 10, for example, a gold film is formed as a conductive film 16 by plating. Then, as shown in FIG. 11, a bump electrode 8, consisting of a conductive film 16 and a UBM film 14, is formed by removing the pattern resist film 15 and the UBM film 14 portion covered by the resist film 15. Next, separate semiconductor chips are produced by dicing the semiconductor substrate.

According to the first embodiment, since the pad 10 formed just beneath the bump electrode 8 is small, wires 11a and 11b can be formed beneath the bump electrode 8. The pad 10 and the wires 11a and 11b can be formed in the same layer just beneath the bump electrode 8, so that the space left just beneath the bump electrode 8 can be effectively used and the semiconductor chip size can be reduced.

The method of manufacturing a semiconductor device according to the first embodiment is the same as conventional semiconductor device manufacturing methods except that patterning is done in a way to form, just beneath the bump electrode 8, the pad 10 and the wires 11a and 11b which should lie in the same layer as the pad 10. Therefore, a semiconductor device according to the first embodiment is manufactured without complicating the manufacturing process. This means that an advantageous effect is achieved without any drastic change in the manufacturing process.

Figure 12:
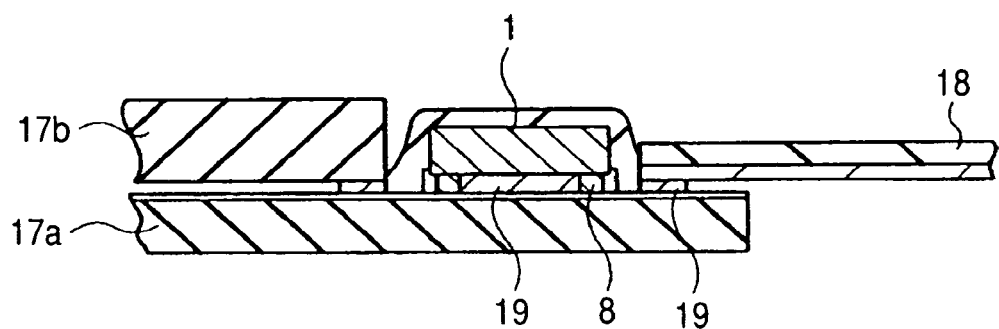
FIG. 12 shows that a semiconductor chip is mounted on a glass substrate.

Next, a semiconductor chip produced as mentioned above is bonded to a packaging substrate. FIG. 12 shows a case that the semiconductor chip 1 is mounted over a glass substrate 17a (COG: Chip On Glass). As shown in FIG. 12, a glass substrate 17b is mounted on the glass substrate 17a, forming an LCD screen area. A semiconductor chip 1 as an LCD driver is mounted on the glass substrate 17a in the vicinity of the LCD screen area. The semiconductor chip 1 has bump electrodes 8 where the bump electrodes 8 are connected with terminals formed on the glass substrate 17a through anisotropic conductive film 19. The glass substrate 17a and a flexible printed circuit 18 are also connected through the anisotropic conductive film 19. In the semiconductor chip 1 mounted on the glass substrate 17a in this way, a bump electrode 8 for output is electrically connected with the LCD screen area and a bump electrode 8 for input is connected with the flexible printed circuit board 18.

Figure 13:
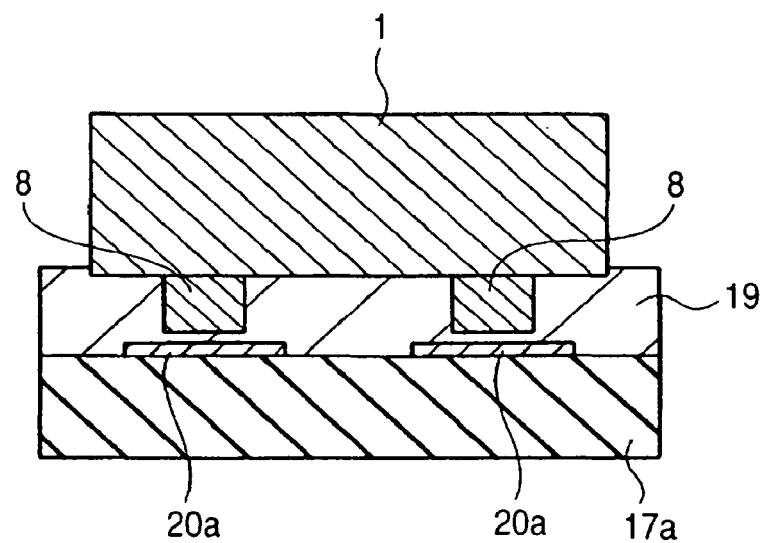
FIG. 13 is an enlarged view of the semiconductor chip mounted on the glass substrate.

FIG. 13 is an enlarged view of the semiconductor chip 1 mounted on the glass substrate 17a. As shown in FIG. 13, terminals 20a lie over the glass substrate 17a and bump electrodes 8 of the semiconductor chip 1 are electrically connected with the terminals 20a. Here, the bump electrodes 8 and the terminals 20a are connected not directly but through the anisotropic conductive film 19.

Figure 14:
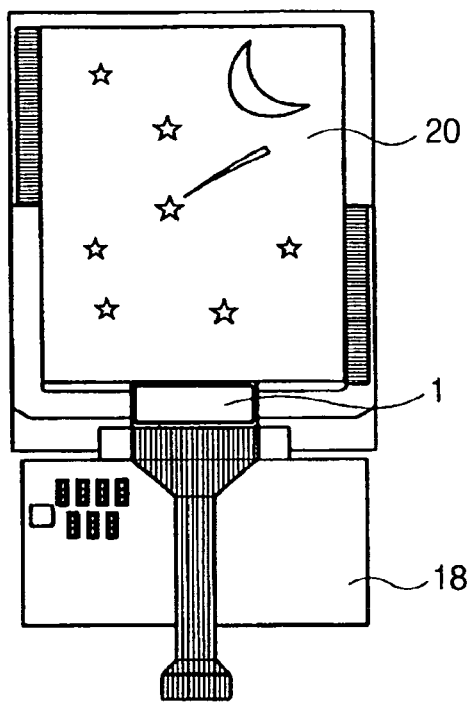
FIG. 14 shows the general structure of an LCD.

FIG. 14 shows the general structure of the LCD. As shown in FIG. 14, the LCD screen area 20 lies over the glass substrate and an image appears on the screen area 20. The semiconductor chip 1 as an LCD driver is mounted over the glass substrate in the vicinity of the screen area 20. The flexible printed circuit board 18 is mounted in the vicinity of the semiconductor chip 1 and the semiconductor chip 1 as a driver lies between the printed circuit board 18 and the LCD screen area 20. The semiconductor chip 1 may be mounted over the glass substrate 17a in this way.

So far, the process of mounting an LCD driver on a packaging substrate has been explained as an example of COG where a semiconductor chip 1 is mounted on the glass substrate 17a. Next, other forms of process of packaging semiconductor chips 1 will be explained.

Figure 16:
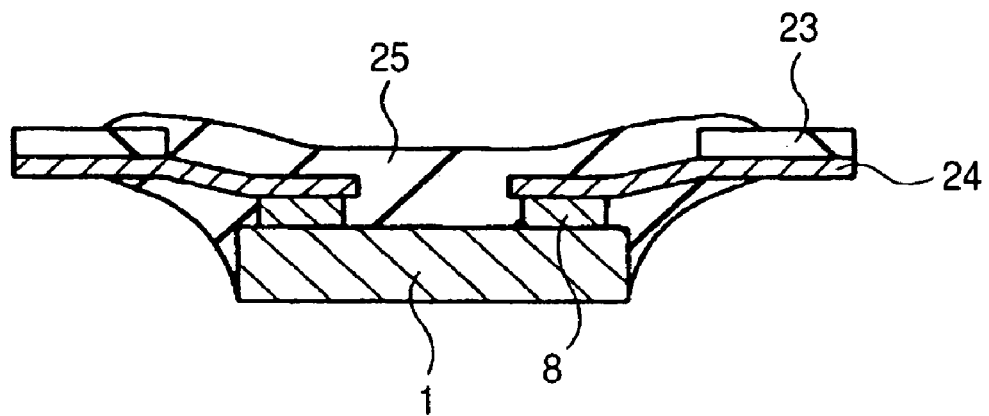
FIG. 16 shows how a semiconductor chip is mounted on a packaging substrate in the TCP (Tape Carrier Package) form.
Figure 17:
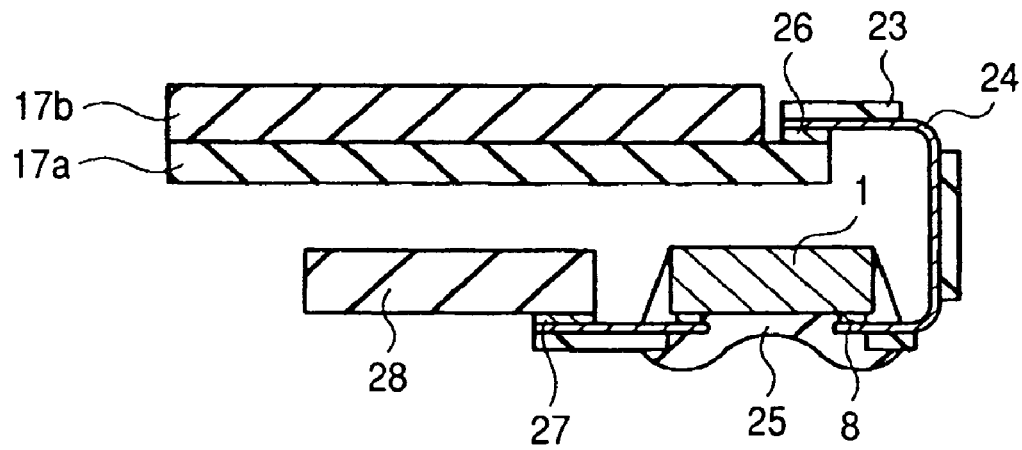
FIG. 17 shows an example in which a semiconductor chip packaged in the TCP form lies between a glass substrate and a printed circuit board.

FIG. 15 shows a TCP (Tape Carrier Package) form 21 and a COF (Chip On Film) form 22 as non-COG examples of semiconductor chip packaging. FIG. 16 shows how a semiconductor chip 1 is mounted on a packaging substrate in the TCP form. Referring to FIG. 16, the packaging substrate is a film substrate in the tape form (tape substrate) 23 and for example, a lead wire of copper 24 is formed over the film substrate 23. The semiconductor chip 1 is mounted over the film substrate 23 so that a bump electrode 8 adheres to the lead wire 24. The semiconductor chip 1 is sealed with resin 25. FIG. 17 shows an example in which a semiconductor chip 1 packaged in the TCP form lies between the glass substrate 17a and the printed circuit board 28. As illustrated in FIG. 17, the glass substrate 17a is connected with the lead wire 24 formed over the film substrate 23 through anisotropic conductive film 26 and similarly the lead wire 24 formed over the film substrate 23 is connected with the printed circuit board 28 through anisotropic conductive film 27.

Figure 18:
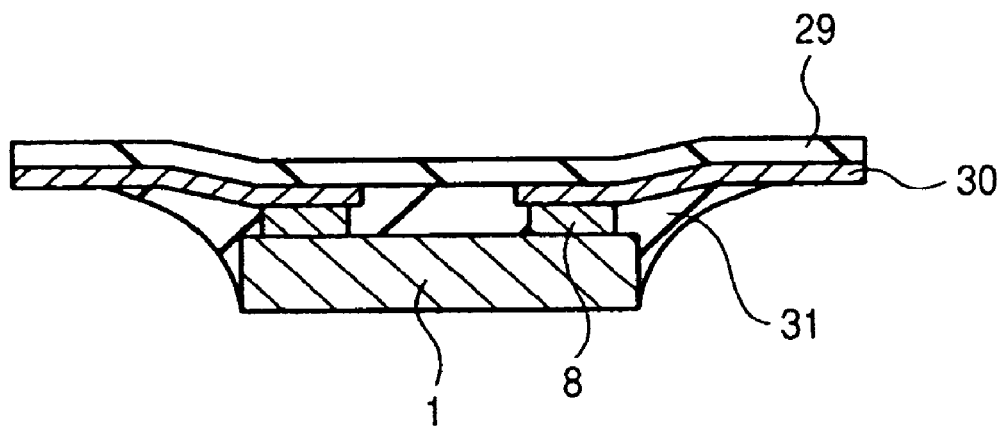
FIG. 18 shows how a semiconductor chip is mounted on a packaging substrate in the COF (Chip On Film) form.
Figure 19:
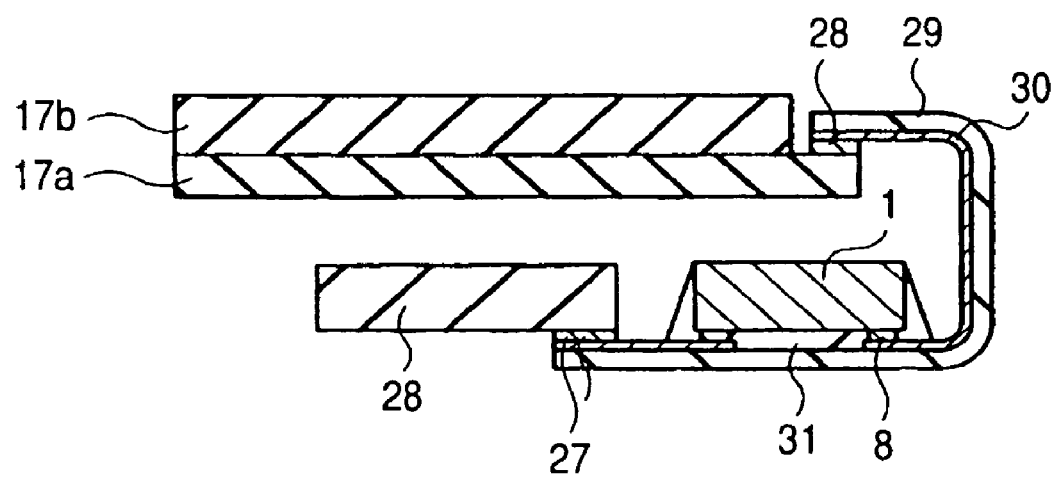
FIG. 19 shows an example in which a semiconductor chip packaged in the COF form lies between a glass substrate and a printed circuit board.

FIG. 18 shows how a semiconductor chip 1 is mounted on a packaging substrate in the COF form. Referring to FIG. 18, the packaging substrate is a film substrate 29 in the tape form. As in the TCP form, a lead wire of copper 30 lies over the film substrate 29 but unlike the TCP form, the lead wire 30 is fixed on the film substrate 29 even at the area of connection with a bump electrode 8. A semiconductor chip 1 is mounted over the film substrate 29 in a manner that the bump electrode 8 adheres to the lead wire 30. There is underfill 31 in the gap between the semiconductor chip 1 and the film substrate 29. FIG. 19 shows an example in which a semiconductor chip 1 is mounted between a glass substrate 17a and a printed circuit board 28 in the COF form. As illustrated in FIG. 19, the glass substrate 17a is connected with a lead wire 30 formed over a film substrate 29 through anisotropic conductive film 26 and similarly the lead wire 30 formed over the film substrate 29 is connected with the printed circuit board 28 through anisotropic conductive film 27.

A semiconductor chip 1 as an LCD driver may be packaged in various forms as mentioned above.

Second Embodiment

The second embodiment concerns a semiconductor device with wide layout latitude which optimizes pad positions regardless of bump electrode positions.

Figure 20:
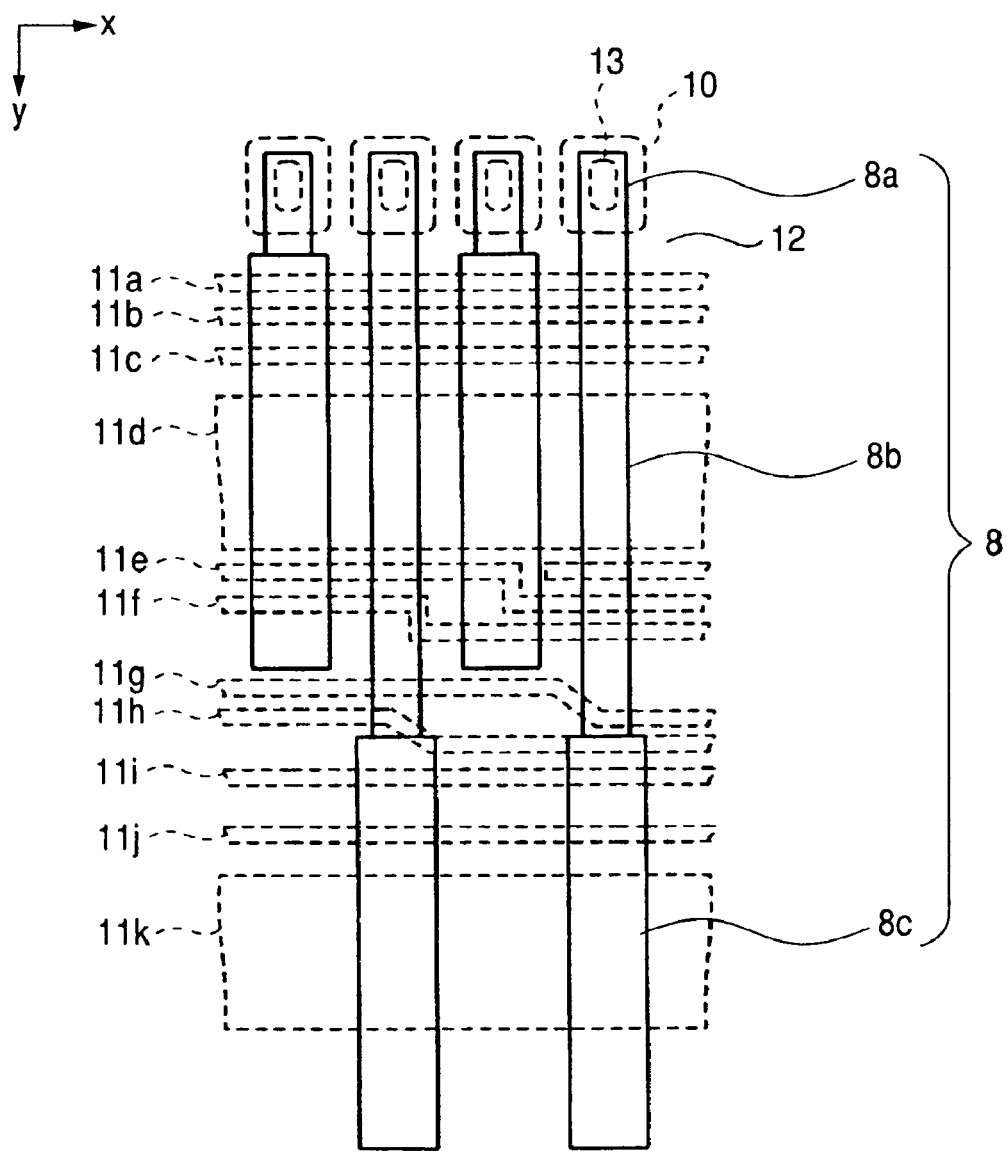
FIG. 20 is a fragmentary plan view of a semiconductor chip according to a second embodiment of the invention.

FIG. 20 is a fragmentary plan view of a semiconductor chip according to the second embodiment. Referring to FIG. 20, a pad 10 is connected with a pad connection portion 8a as a part of a bump electrode 8 through an opening 13 made in a surface protective film 12. The bump electrode 8 consists of: a pad connection portion 8a to be connected with the pad 10; a terminal connection portion 8c to be connected with a terminal of a packaging substrate; and a wiring portion 8b which connects the pad connection portion 8a and the terminal connection portion 8c. A conventional bump electrode consists of only a terminal connection portion which is connected with a pad. In other words, in a conventional bump electrode, the terminal connection portion also functions as a pad connection portion, which means that the pad connection portion and the terminal connection portion overlap each other as seen in a plan view. On the other hand, in the bump electrode 8 according to the second embodiment, the pad connection portion 8a and the terminal connection portion 8c are formed in different places as seen in a plan view and the pad connection portion 8a and the terminal connection portion 8c in different places as seen in a plan view are connected by the wiring portion 8b. The pad connection portion 8a and the terminal connection portion 8c are larger than the wiring portion 8b in terms of wire width, as seen in a plan view. This is because the pad connection portion 8a and the terminal connection portion 8c have to be connected with the pad 10 and the lead wire on the glass substrate (or film substrate) respectively and therefore their flat surfaces must be large enough to secure the connections. Since the wire width of the wiring portion 8b is relatively small, contact with other wiring portions 8b is less likely, permitting greater latitude in interconnection wiring arrangement.

Since each bump electrode 8 is thus structured, pads 10 can be arranged not in a zigzag pattern but in one row in the X direction while terminal connection portions 8c of bump electrodes 8 are arranged in a zigzag pattern. This means that the positions of pads can be determined regardless of the positions of bump electrodes. Conventionally, bump electrodes and pads overlap as seen in a plan view; and when bump electrodes are arranged in a zigzag pattern in the y direction, pads should also be arranged in a zigzag pattern in the y direction. In this case, pads are arranged in two rows and wires different from the pads cannot be laid in areas where the pads lie. Consequently, in this case, even when a pad is made smaller than a bump electrode in order to form wires different from a pad as mentioned above according to the first embodiment, it would be impossible to increase space for formation of wires different from pads because pads are formed in two rows in the y direction. On the other hand, according to the second embodiment, even when bump electrodes 8 are arranged in a zigzag pattern, pads 10 need not be arranged in a zigzag pattern and can be arranged in one row in the x direction as shown in FIG. 20. Therefore, space occupied by pads 10 is smaller than when pads 10 are arranged in two rows. Since the space occupied by pads 10 is smaller, it is possible to leave enough space to form wires different from pads 10, 11a to 11k, under bump electrodes 8 in the same layer in which the pads 10 lie. Therefore, the semiconductor chip size can be further reduced. The wires 11a to 11k which are formed just beneath bump electrodes 8 need not be linear; they may be folded or curved.

As mentioned above, one characteristic point of the present invention is that a bump electrode 8 consists of a pad connection portion 8a, a wiring portion 8b, and a terminal connection portion 8c, and the pad connection portion 8a and the terminal connection portion 8c do not overlap as seen in a plan view. The pad connection portion 8a, wiring portion 8b and terminal connection portion 8c are in the same layer. This make it possible that bump electrodes 8, extending in the y direction, are arranged in a zigzag pattern while pads 10 are arranged in one row in the x direction. Since the terminal connection portion 8c as a part of the bump electrode 8 is bonded to a packaging substrate such as a glass substrate, its width is made larger than the width of the wiring portion 8b and that of the pad connection portion 8a in order to ensure the required adhesive force. The characteristic point of this embodiment that a bump electrode 8 consists of a pad connection portion 8a, a wiring portion 8b, and a terminal connection portion 8c may be interpreted as follows: a bump electrode 8 includes a narrower wiring portion (first portion) 8b and a terminal connection portion (second portion) 8c which is wider than the wiring portion 8b. This makes it possible that the area of contact with the packaging substrate is sufficient and bump electrodes 8 are arranged in a zigzag pattern at small intervals. Stated another way, the terminal connection portion 8c of a bump electrode 8 is relatively wide because the terminal connection portion 8c is to be bonded to a packaging substrate while the width of the wiring portion 8b is relatively small because the wiring portion 8b is only intended to connect the pad connection portion and the terminal connection portion, so that bump electrodes 8 are arranged in a zigzag pattern at small intervals.

According to the second embodiment, the positions of pads can be determined so as to reduce the semiconductor chip size efficiently regardless of bump electrode positions. In other words, since greater latitude in pad arrangement is permitted, the semiconductor chip size can be reduced efficiently. In addition, since the area of the terminal connection portion 8c of a bump electrode 8 may be increased regardless of the pad 10, the area of contact with the packaging substrate can be changed flexibly.

The method of manufacturing a semiconductor device according to the second embodiment is almost the same as in the first embodiment. The difference is that a bump electrode 8 consists of a pad connection portion 8a, a wiring portion 8b, and a terminal connection portion 8c, and the pad connection portion 8a and the terminal connection portion 8c do not overlap as seen in a plan view. Furthermore, the width of the terminal connection portion 8c should be larger than that of the wiring portion 8b. A semiconductor device according to the second embodiment is manufactured with these points into consideration.

Figure 21:
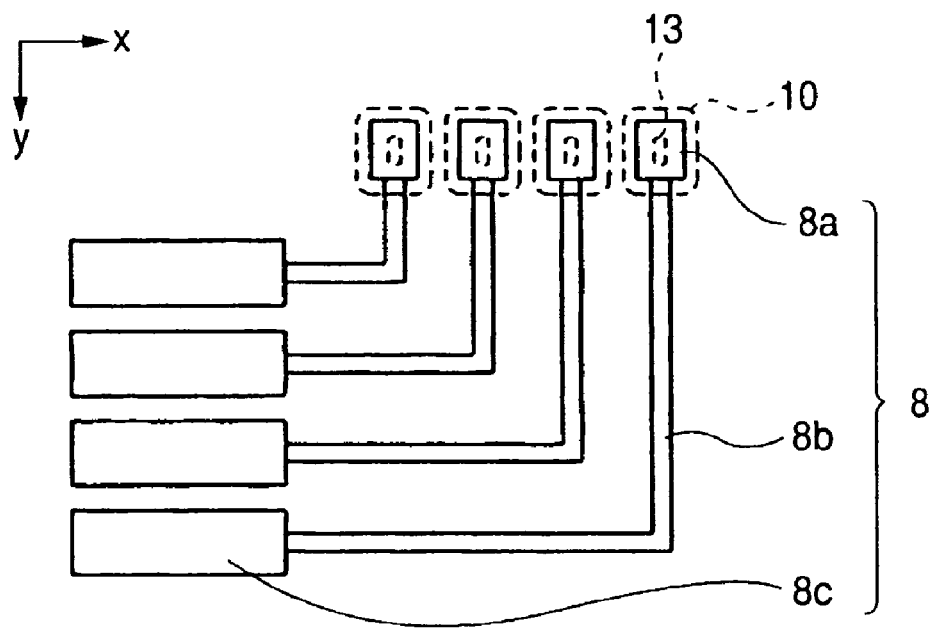
FIG. 21 is a plan view showing a variation of the second embodiment.

Next, a variation of the second embodiment will be explained. FIG. 21 is a plan view of a variation of the second embodiment. FIG. 21 shows a case that pads 10 are arranged in one row in the x direction and the terminal connection portions 8c of bump electrodes 8 are arranged in one row in the y direction. Even this variation can be realized by the use of a bump electrode 8 which consists of a pad connection portion 8a, a wiring portion 8b, and a terminal connection portion 8c. For example, even when the terminal connection portions 8c of bump electrodes 8 are arranged in one row in the y direction in order to meet the customer's request, pads 10 can be arranged in one row in the x direction. The positions of pads 10 can be determined irrespective of where the terminal connection portions 8c are formed. Again, though not shown in FIG. 21, wires different from pads 10 are formed just beneath the bump electrodes 8 in the same layer in which the pads 10 lie. Therefore, space just beneath the bump electrodes 8 can be used effectively so that the semiconductor chip size is reduced. Furthermore, since this permits greater latitude in the layout arrangement of pads 10, the semiconductor chip size can be further reduced by optimizing the positions of pads 10. FIG. 21 indicates that the wiring portions 8b of the bump electrodes 8 are bent at right angles; however, instead it is also possible that they are curved.

Figure 22:
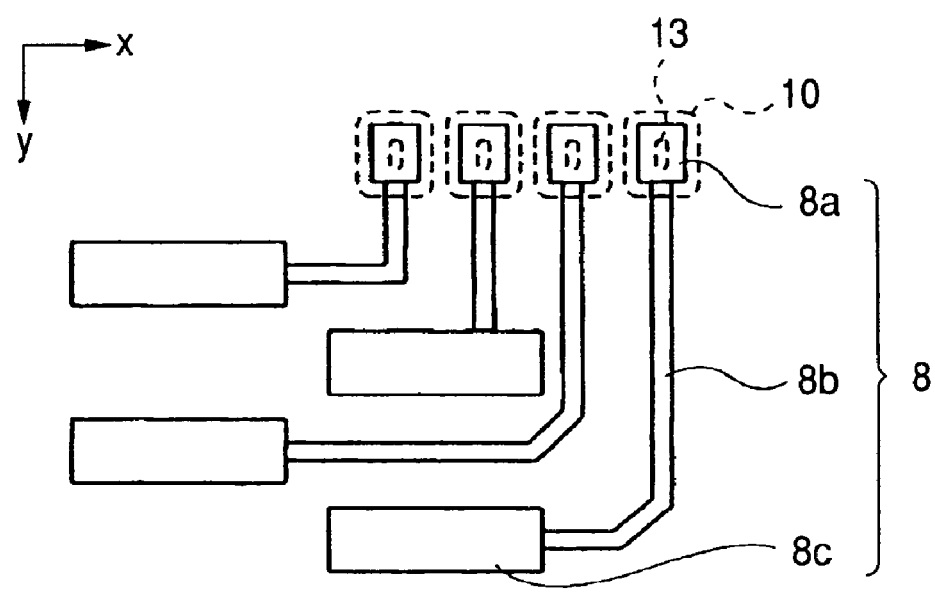
FIG. 22 is a plan view showing another variation of the second embodiment.

FIG. 22 is a plan view showing another variation of the second embodiment. FIG. 22 shows a case that pads 10 are arranged in one row in the x direction and the terminal connection portions 8c of bump electrodes 8 are arranged in a zigzag pattern in the y direction. Even this variation can be realized by the use of a bump electrode 8 which consists of a pad connection portion 8a, a wiring portion 8b, and a terminal connection portion 8c. For example, even when the terminal connection portions 8c of bump electrodes 8 are arranged in a zigzag pattern in the y direction in order to meet the customer's request, pads 10 can be arranged in one row in the x direction. The positions of pads 10 can be determined irrespective of where the terminal connection portions 8c are formed. Again, though not shown in FIG. 22, wires different from pads 10 are formed just beneath the bump electrodes 8 in the same layer in which the pads 10 lie. Therefore, space just beneath the bump electrodes 8 can be used effectively so that the semiconductor chip size is reduced. Furthermore, since this permits greater latitude in the layout arrangement of pads 10, the semiconductor chip size can be further reduced by optimizing the positions of pads 10.

The invention made by the present inventors has been so far explained in detail in reference to preferred embodiments thereof. However, the invention is not limited thereto and it is obvious that these details may be modified in various ways without departing from the spirit and scope thereof.

Although bump electrodes 8 and pads 10 are located along the four edges of a semiconductor chip in the abovementioned embodiments, obviously the invention is not limited thereto. For example, it is also possible that pads 10 are located in the vicinities of the four edges of the semiconductor chip and bump electrodes 8 extend to the center of the semiconductor chip 1. Alternatively it is also possible that pads 10 are located in the center of the semiconductor chip 1 and bump electrodes 8 extend to the four edges of the semiconductor chip 1.

In the description of the above embodiments, it is assumed that a semiconductor device is used as an LCD driver but the invention is not limited thereto and may be applied to a wide range of semiconductor devices which have bump electrodes.

The present invention may be used widely in the semiconductor manufacturing industry.

What is claimed is:

1. A semiconductor device comprising:
   (a) a semiconductor substrate of a substantially rectangular shape;
   (b) semiconductor elements formed over a main surface of said semiconductor substrate;
   (c) a first wiring layer formed over said semiconductor elements;
   (d) a first insulating film formed over said main surface of said semiconductor substrate to cover said first wiring layer;
   (e) a plurality of first pad electrodes and a plurality of second pad electrodes formed over said first insulating film;
   (f) a second wiring layer formed over said first insulating film, said second wiring layer being formed at a same level as said first and second pad electrodes;
   (g) a second insulating film to cover said first and second pad electrodes and said second wiring layer, said second insulating film having openings at upper sides of said first and second pad electrodes, respectively; and
   (h) a plurality of first bump electrodes and a plurality of second bump electrodes of substantially rectangular shape formed over said second insulating film, said first and second bump electrodes being electrically connected to corresponding ones of said first and second pad electrodes via said openings of said second insulating film, respectively,
   wherein said first pad electrodes and said first bump electrodes are for outputting signals and arranged in a zigzag pattern in plan view in a vicinity of a first long side of said semiconductor substrate, said first pad electrodes and said first bump electrodes being respectively arranged at predetermined intervals in a first direction which is along said first long side of said semiconductor substrate,
   wherein said second pad electrodes and said second bump electrodes are for inputting signals and arranged linearly in a vicinity of a second long side of said semiconductor substrate, said second pad electrodes and said second bump electrodes being respectively arranged at predetermined intervals in said first direction,
   wherein each of said first bump electrodes and each of said second bump electrodes are configured such that long sides thereof extend in a second direction which is along a first short side of said semiconductor substrate, and
   wherein said second wiring layer is disposed directly under at least said first bump electrodes or said second bump electrodes and extends along said first direction.

2. A semiconductor device according to claim 1,
   wherein a third wiring layer is formed over said first insulating film, said third wiring layer being formed at a same level as said second wiring layer,
   wherein said second wiring layer is disposed directly under said first bump electrodes, and
   wherein said third wiring layer is disposed directly under said second bump electrodes.

3. A semiconductor device according to claim 1,
   wherein, for each of said first and second bump electrodes, a width thereof in said first direction is smaller than a width of the corresponding pad electrode in said first direction, and
   wherein, for each of said first and second bump electrodes, a width thereof in said second direction is larger than a width of the corresponding pad electrode in said second direction.

4. A semiconductor device according to claim 1, wherein said second insulating film is a silicon nitride film.

5. A semiconductor device according to claim 1, wherein said first insulating film is a silicon oxide film.

6. A semiconductor device according to claim 1, wherein each of said first and second bump electrodes is formed of a gold film.

7. A semiconductor device according to claim 1,
   wherein each of said second wiring layer and said first and second pad electrodes includes an aluminum film, and
   wherein each of said second wiring layer and said first and second pad electrodes further includes, on each side of said aluminum film thereof, one of a titanium film and a titanium nitride film.

8. A semiconductor device according to claim 1, wherein said second wiring layer includes a power wire.

9. A semiconductor device according to claim 1, wherein said second wiring layer is formed of a conducting layer, said conducting layer not being formed between adjacent first pad electrodes or adjacent second pad electrodes.

10. A semiconductor device according to claim 1, wherein said second wiring layer is a top layer interconnection wiring.

11. A semiconductor device according to claim 1, wherein said semiconductor elements include a portion of circuits which drive a liquid crystal display.

12. A semiconductor device according to claim 11, wherein said first bump electrodes are for gate output signals or source output signals.

13. A semiconductor device according to claim 11, including additional pad electrodes and corresponding additional bump electrodes for outputting signals arranged in zigzag pattern in a vicinity of said first short side and a second short side of said semiconductor substrate and respectively arranged at predetermined intervals in said second direction.

14. A semiconductor device according to claim 13, wherein said additional bump electrodes are for gate output signals.

15. A semiconductor device according to claim 11,
   wherein said first bump electrodes include a plurality of third bump electrodes, a plurality of fourth bump electrodes, and a plurality of fifth bump electrodes,
   wherein said third bump electrodes are disposed in a vicinity of said first short side,
   wherein said fourth bump electrodes are disposed in a vicinity of a second short side of said semiconductor substrate,
   wherein said third and fourth bump electrodes are for gate output signals,
   wherein said fifth bump electrodes are disposed between said third and fourth bump electrodes in said first direction, and wherein said fifth bump electrodes are for source output signals.

16. A semiconductor device according to claim 1, wherein said openings of said second insulating film are disposed near one short edge of said first and second bump electrodes.

17. A semiconductor device according to claim 1, wherein said second bump electrodes are adapted to be electrically connected with a flexible printed circuit.

18. A semiconductor device comprising:
(a) a semiconductor substrate of a substantially rectangular shape;
(b) semiconductor elements formed over a main surface of said semiconductor substrate;
(c) a first wiring layer formed over said semiconductor elements;
(d) a first insulating film formed over said main surface of said semiconductor substrate to cover said first wiring layer;
(e) a plurality of first pad electrodes, a plurality of second pad electrodes, and a plurality of third pad electrodes formed over said first insulating film;
(f) a second wiring layer formed over said first insulating film, said second wiring layer being formed at a same level as said first, second, and third pad electrodes;
(g) a second insulating film to cover said first, second, and third pad electrodes and said second wiring layer, said second insulating film having openings at upper sides of said first, second, and third pad electrodes, respectively; and
(h) a plurality of first bump electrodes, a plurality of second bump electrodes, a plurality of third bump electrodes of substantially rectangular shape formed over said second insulating film, said first, second, and third bump electrodes being electrically connected to corresponding ones of said first, second, and third pad electrodes via said openings of said second insulating film, respectively,
wherein said first, second, and third bump electrodes are arranged linearly at predetermined intervals in a first direction which is along a first long side of said semiconductor substrate,
wherein said first and second bump electrodes are disposed in a vicinity of said first long side of said semiconductor substrate and arranged in a zigzag pattern in plan view,
wherein said first and second bump electrodes are for outputting signals,
wherein said third bump electrodes are disposed in a vicinity of a second long side of said semiconductor substrate,
wherein said third bump electrodes are for inputting signals,
wherein each of said first bump electrodes, each of said second bump electrodes, and each of third bump electrodes are configured such that long sides thereof extend in a second direction which is along a first short side of said semiconductor substrate, and
wherein said second wiring layer is disposed directly under at least said first bump electrodes, said second bump electrodes, or said third bump electrodes and extends along said first direction.

19. A semiconductor device according to claim 18, wherein said second wiring layer is disposed directly under said first bump electrodes or second bump electrodes.

20. A semiconductor device according to claim 18,
wherein a third wiring layer is formed over said first insulating film, said third wiring layer being formed at a same level as said second wiring layer,
wherein said second wiring layer is disposed directly under said first bump electrodes, and
wherein said third wiring layer is disposed directly under said second bump electrodes.

21. A semiconductor device according to claim 20,
wherein a fourth wiring layer is formed over said first insulating film, said third wiring layer being formed at a same level as said second and third wiring layers,
wherein said fourth wiring layer is disposed directly under said third bump electrodes.

22. A semiconductor device according to claim 18,
wherein, for each of said first, second, and third bump electrodes, a width thereof in said first direction is smaller than a width of the corresponding pad electrode in said first direction, and
wherein, for each of said first, second, and third bump electrodes, a width thereof in said second direction is larger than a width of the corresponding pad electrode in said second direction.

23. A semiconductor device according to claim 18, wherein said openings are disposed near one short edge of said first, second, and third bump electrodes.

24. A semiconductor device according to claim 18, wherein said second insulating film is a silicon nitride film.

25. A semiconductor device according to claim 18, wherein said first insulating film is a silicon oxide film.

26. A semiconductor device according to claim 18, wherein each of said first and second bump electrodes is formed of a gold film.

27. A semiconductor device according to claim 18,
wherein each of said second wiring layer and said first, second, and third pad electrodes includes an aluminum film, and
wherein each of said second wiring layer and said first, second, and third pad electrodes further includes, on each side of said aluminum film thereof, one of a titanium film and a titanium nitride film.

28. A semiconductor device according to claim 18, wherein said second wiring layer includes a power wire.

29. A semiconductor device according to claim 18, wherein said second wiring layer is formed of a conducting layer, said conducting layer not being formed between adjacent first pad electrodes, adjacent second pad electrodes, or adjacent third pad electrodes.

30. A semiconductor device according to claim 18, wherein said second wiring layer is a top layer interconnection wiring.

31. A semiconductor device according to claim 18, wherein said semiconductor elements include a portion of circuits which drive a liquid crystal display.

32. A semiconductor device according to claim 31, wherein said first, second, and third bump electrodes are for gate output signals or source output signals.

33. A semiconductor device according to claim 31, including additional pad electrodes and corresponding additional bump electrodes for outputting signals arranged in zigzag pattern in a vicinity of said first short side and a second short side of said semiconductor substrate and respectively arranged at predetermined intervals in said second direction.

34. A semiconductor device according to claim 33, wherein said additional bump electrodes are for gate output signals.

35. A semiconductor device according to claim 31,
wherein said first bump electrodes include a plurality of fourth bump electrodes, a plurality of fifth bump electrodes, and a plurality of sixth bump electrodes, wherein said second bump electrodes include a plurality of seventh bump electrodes, a plurality of eighth bump electrodes, and a plurality of ninth bump electrodes, wherein said fourth and seventh bump electrodes are disposed in a vicinity of said first short side of said semiconductor substrate, wherein said fifth and eighth bump electrodes are disposed in a vicinity of a second short side of said semiconductor substrate, wherein said sixth bump electrodes are disposed between said fourth and fifth bump electrodes in said first direction, wherein said ninth bump electrodes are disposed between said seventh and eighth bump electrodes in said first direction, wherein said fourth, fifth, seventh, and eighth bump electrodes are for gate output signals, and wherein said sixth and ninth bump electrodes are for source output signals.

36. A semiconductor device according to claim 31, wherein said third bump electrodes are adapted to be electrically connected with a flexible printed circuit.

* * * * *